(12) United States Patent  
Fest (10) Patent No.: US 8,836,128 B1
(45) Date of Patent: Sep. 16, 2014

(54) FORMING FENCE CONDUCTORS IN AN INTEGRATED CIRCUIT

(71) Applicant: Microchip Technology Incorporated, Chandler, AZ (US)

(72) Inventor: Paul Fest, Chandler, AZ (US)

(73) Assignee: Microchip Technology Incorporated, Chandler, AZ (US)

( * ) Notice: Subject to any disclaimer, the term of this patent is extended or adjusted under 35 U.S.C. 154(b) by 0 days.

(21) Appl. No.: 13/838,784

(22) Filed: Mar. 15, 2013

(51) Int. Cl.
*H01L 23/48* (2006.01)
*H01L 21/768* (2006.01)

(52) U.S. Cl.
CPC ................... *H01L 21/76814* (2013.01)
USPC ........... 257/758; 257/446; 257/773; 438/596; 438/618; 438/629

(58) Field of Classification Search
CPC ............ H01L 21/0337; H01L 21/0338; H01L 21/76816; H01L 21/31144; H01L 23/528; H01L 23/5222; H01L 23/533295
USPC ........... 257/773, 758, 446; 438/596, 618, 629
See application file for complete search history.

(56) References Cited

U.S. PATENT DOCUMENTS

| | | | |
|---|---|---|---|
| 6,190,986 B1 | 2/2001 | Arndt et al. | 438/381 |
| 6,632,741 B1 * | 10/2003 | Clevenger et al. | 438/689 |
| 2006/0154463 A1 | 7/2006 | Furukawa et al. | 438/596 |
| 2008/0142995 A1 * | 6/2008 | Furukawa et al. | 257/786 |
| 2008/0284021 A1 | 11/2008 | Anderson et al. | 257/751 |

FOREIGN PATENT DOCUMENTS

| | | | |
|---|---|---|---|
| EP | 1298727 A2 | 4/2003 | |
| EP | 1359613 A2 | 11/2003 | |

OTHER PUBLICATIONS

International Search Report and Written Opinion, Application No. PCT/US2014/019729, 14 pages Jun. 3, 2014.

* cited by examiner

*Primary Examiner* — David Vu
*Assistant Examiner* — Brandon Fox
(74) *Attorney, Agent, or Firm* — King & Spalding L.L.P.

(57) ABSTRACT

A spacer etching process produces ultra-narrow conductive lines in a plurality of semiconductor dice. Sub-lithographic patterning of the conductive lines are compatible with existing aluminum and copper backend processing. A first dielectric is deposited onto the semiconductor dice and trenches are formed therein. A conductive film is deposited onto the first dielectric and the trench surfaces. All planar conductive film is removed from the faces of the semiconductor dice and bottoms of the trenches, leaving only conductive films on the trench walls, whereby "fence conductors" are created therefrom. Thereafter the gap between the conductive films on the trench walls are filled in with insulating material. A top portion of the insulated gap fill is thereafter removed to expose the tops of the fence conductors. Portions of the fence conductors and surrounding insulating materials are removed at appropriate locations to produce desired conductor patterns comprising isolated fence conductors.

19 Claims, 12 Drawing Sheets

FORMING FENCE CONDUCTORS IN AN INTEGRATED CIRCUIT

TECHNICAL FIELD

The present disclosure relates to semiconductor integrated circuit (IC) fabrication, and more particularly, to forming sub-lithographic patterns of conductive lines in the semiconductor die (e.g., integrated circuit die) during fabrication thereof.

BACKGROUND

Reduction in the size of patterned conductive lines used for interconnection of active elements, e.g., transistors, in a semiconductor die has been limited by the lithographic processes available. As the number of transistors have increased on the semiconductor die resulting from improvements in the lithographic masking processes forming these transistors, conductive lines that must interconnect these ever decreasing in size transistors have been unable to decrease proportionally in size with the smaller transistors.

SUMMARY

Therefore, there is need for a way to decrease the size of patterned conductive lines without the limitations of the lithographic processes available for manufacturing semiconductor integrated circuits.

According to an embodiment, a method for forming fence conductors in a semiconductor integrated circuit die may comprise the steps of: depositing a first dielectric on a face of a semiconductor substrate; creating at least one trench in the first dielectric; depositing a conductive film on the first dielectric including walls and a bottom of the at least one trench; removing portions of the conductive film from a face of the first dielectric and the bottom of the at least one trench, wherein only the conductive film remains on the walls of the at least one trench; depositing a second dielectric between the conductive film on the walls of the at least one trench; and removing a portion of the second dielectric to expose top portions of the conductive film on the walls of the at least one trench.

According to a further embodiment of the method, after the step of removing a portion of the second dielectric to expose top portions of the conductive film on the walls of the at least one trench, may comprise the step of separating portions of the conductive film on the walls of the at least one trench into independent fence conductors. According to a further embodiment, after the step of removing portions of the conductive film from a face of the first dielectric and the bottom of the at least one trench, may comprise the step of separating portions of the conductive film on the walls of the at least one trench into independent fence conductors.

According to a further embodiment, the step of depositing the first dielectric may comprise the step of depositing the first dielectric to a thickness of from about 100 to about 2000 nanometers on the face of the semiconductor substrate. According to a further embodiment, the step of creating the at least one trench may comprise the step of creating the at least one trench to a depth of from about 100 to about 2000 nanometers in the first dielectric. According to a further embodiment, the step of creating the at least one trench may comprise the step of creating the at least one trench having a width of from about 100 to about 2000 nanometers in the first dielectric. According to a further embodiment, the step of depositing the conductive film may comprise the step of depositing the conductive film to a thickness of from about 10 to about 1000 nanometers. According to a further embodiment, the step of depositing the second dielectric may comprise the step of depositing the second dielectric to a thickness of from about 100 to about 2000 nanometers.

According to a further embodiment, the conductive film may comprise an aluminum film. According to a further embodiment, the conductive film may be selected from the group consisting of Ta, TaN, Ti, TiN, Si, WSi and CoSi. According to a further embodiment, the step of separating portions of the conductive film may comprise the step of separating portions of the conductive film with reactive-ion etching (RIE). According to a further embodiment, the RIE may be aggressive. According to a further embodiment, may comprise the steps of filling gaps created by the RIE with dielectric and chemical mechanical planarization (CMP) polishing thereof.

According to another embodiment, a semiconductor die may comprise: a semiconductor substrate; a first dielectric on a face of the semiconductor substrate; at least one trench in the first dielectric; conductive films on walls of the at least one trench; and a second dielectric filling a space between the conductive films on the walls of the at least one trench, wherein the conductive films may be separated and used as fence conductors to connect active elements of said semiconductor die.

According to a further embodiment, a semiconductor wafer may comprise a plurality of semiconductor dice. According to a further embodiment, the first dielectric may have a thickness from about 100 to about 2000 nanometers. According to a further embodiment, the at the least one trench may have a depth from about 100 to about 2000 nanometers and a width from about 100 to about 2000 nanometers. According to a further embodiment, the conductive films may have a thickness of from about 10 to about 1000 nanometers. According to a further embodiment, the second dielectric may have a thickness from about 100 to about 2000 nanometers. According to a further embodiment, the conductive film may be selected from the group consisting of Al, Ta, TaN, Ti, TiN, Si, WSi and CoSi.

BRIEF DESCRIPTION OF THE DRAWINGS

A more complete understanding of the present disclosure may be acquired by referring to the following description taken in conjunction with the accompanying drawings wherein.

While the present disclosure is susceptible to various modifications and alternative forms, specific example embodiments thereof have been shown in the drawings and are herein described in detail. It should be understood, however, that the description herein of specific example embodiments is not intended to limit the disclosure to the particular forms disclosed herein, but on the contrary, this disclosure is to cover all modifications and equivalents as defined by the appended claims.

DETAILED DESCRIPTION

According to the teachings of this disclosure, a spacer etching process may be used to produce ultra-narrow conductive lines in a plurality of semiconductor dice. Sub-lithographic patterning of conductive lines may be produced in a fabrication process that is compatible with existing aluminum and copper backend processing. A first dielectric may be deposited on each semiconductor die, and at least one trench formed therein. A conductive film may be deposited onto the first dielectric and the surfaces of the at least one trench formed therein. Conductive film may be removed from the top face of the first dielectric and bottom of the at least one trench, leaving only conductive films on the trench walls, whereby "fence conductors" may be created therefrom as more fully described hereinafter. Selected portions of the fence conductors may also be selectively "broken" e.g., removed, during the aforementioned step. Thereafter the gap between the conductive films on the trench walls may be filled in with insulating material. A top portion of the insulated gap fill may thereafter be removed, e.g., by polishing, to expose the tops of the fence conductors. Portions of the fence conductors and surrounding insulating materials may be removed at appropriate locations (e.g., disconnected, broken, etc.) to produce desired conductor patterns comprising the fence conductors. The trench depth may help in determining one dimension of the fence conductors, e.g., conductor height, and the thickness of the deposited conductive film may determine a second dimension, e.g., conductor width. Lengths of the fence conductors may be determined by where the continuous fence conductors are "broken," e.g., separated, disconnections made therebetween, etc., from each other.

Referring now to the drawings, the details of specific example embodiments are schematically illustrated. Like elements in the drawings will be represented by like numbers, and similar elements will be represented by like numbers with a different lower case letter suffix.

Figure 1:
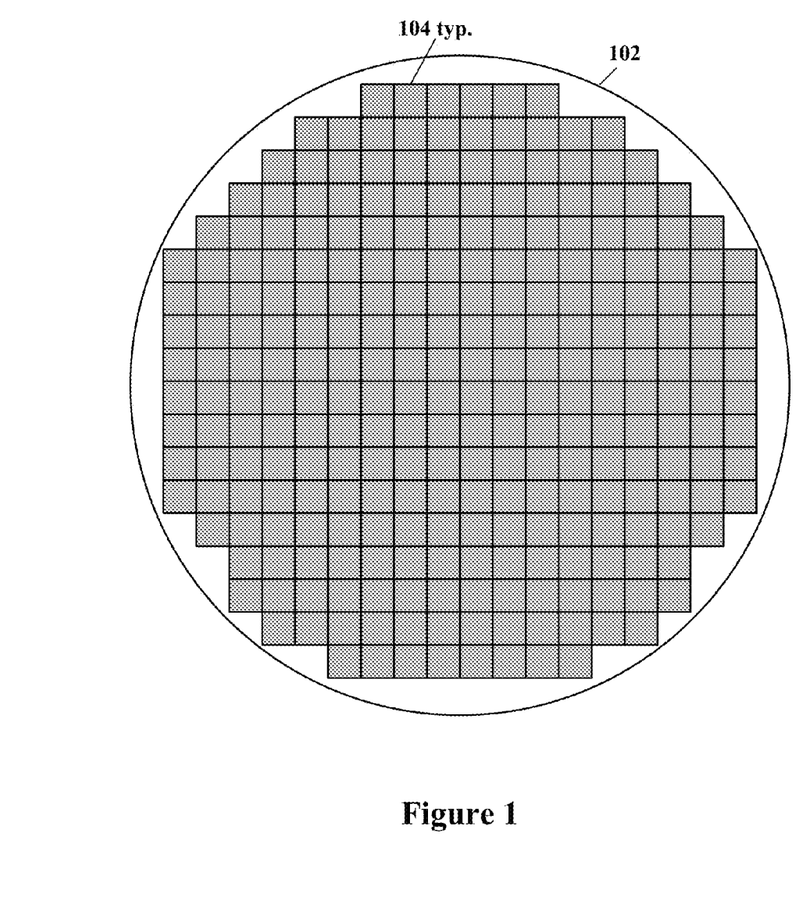
FIG. 1 illustrates a schematic plan view diagram of a semiconductor integrated circuit wafer comprising a plurality of semiconductor dice.

Referring to FIG. 1 illustrates a schematic plan view diagram of a semiconductor integrated circuit wafer comprising a plurality of semiconductor dice. A silicon wafer 102 may be scribed into a plurality of semiconductor dice 104 for further processing to create planar transistors, diodes and conductors on each of the plurality of semiconductor dice 104. After all circuits have been fabricated on the plurality of semiconductor dice 104, the dice 104 are singulated (separated) and packaged into integrated circuits (not shown).

Figure 2:
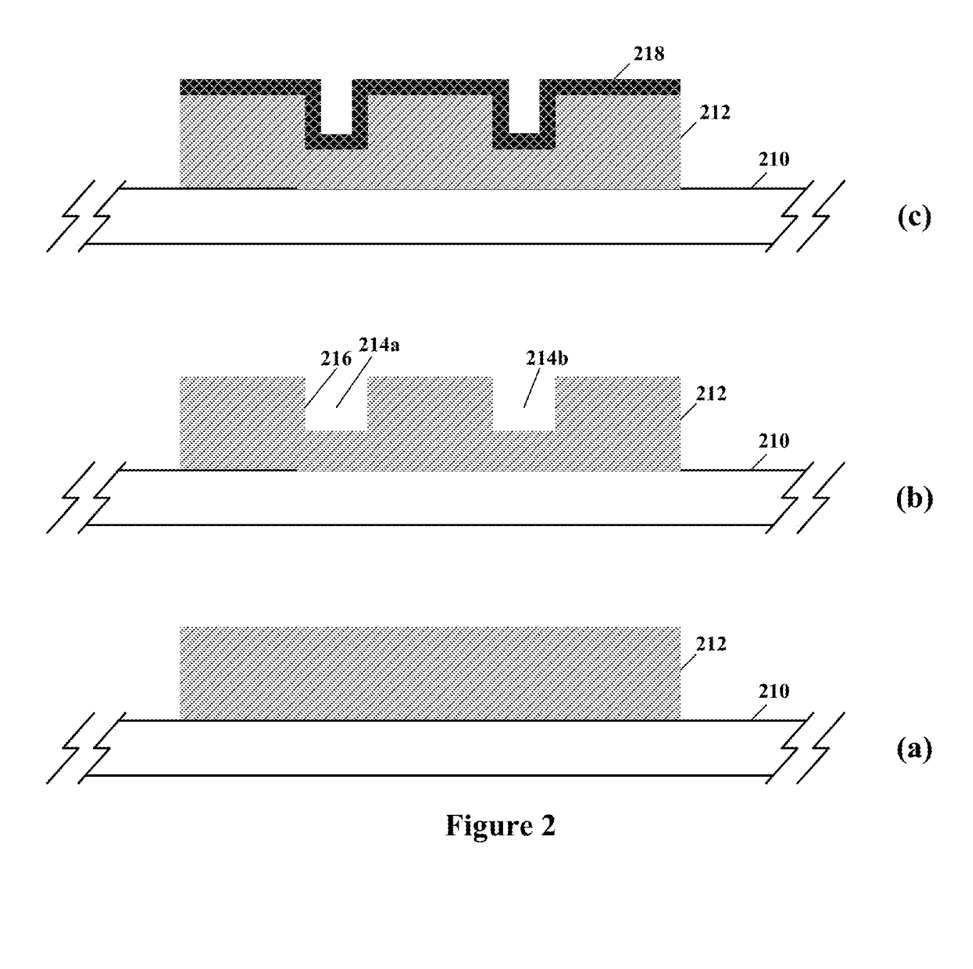
FIG. 2 illustrates schematic elevational diagrams of semiconductor fabrication steps for forming sub-lithographic patterns of conductive lines in a semiconductor die, according to specific example embodiments of this disclosure.
Figure 3:
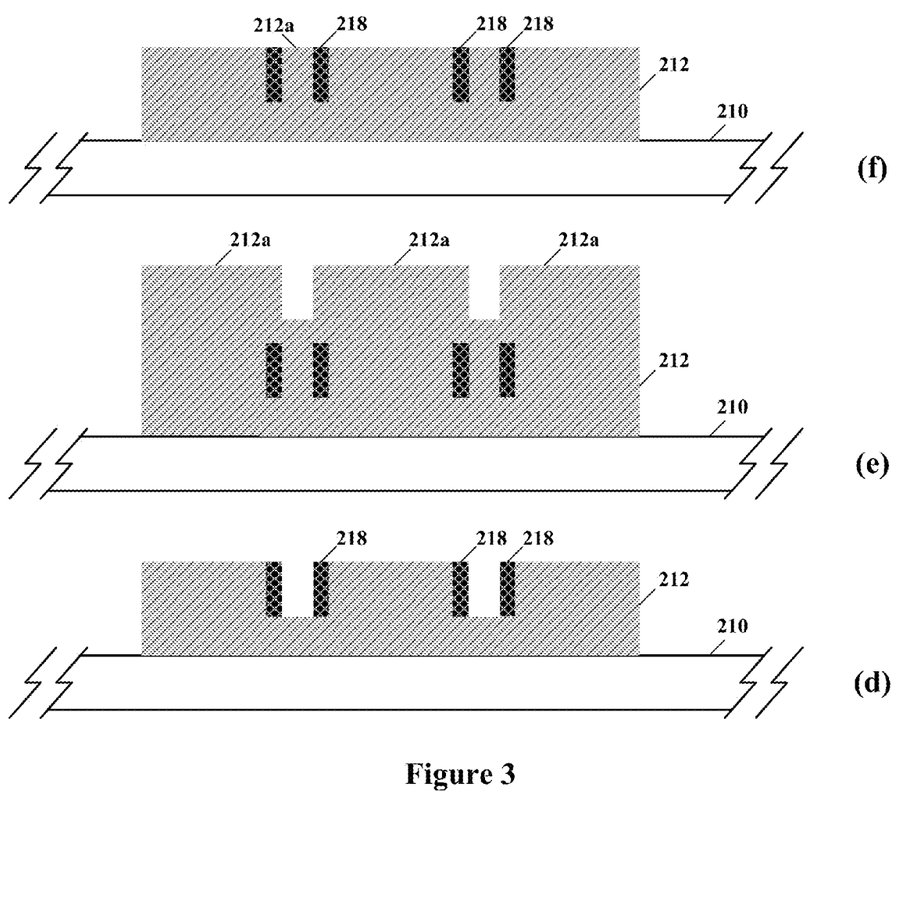
FIG. 3 illustrates schematic elevational diagrams of further semiconductor fabrication steps for forming sub-lithographic patterns of conductive lines in the semiconductor die, according to specific example embodiments of this disclosure.

Referring to FIGS. 2 and 3, depicted are schematic elevational diagrams of semiconductor fabrication steps for forming sub-lithographic patterns of conductive lines in a semiconductor die, according to specific example embodiments of this disclosure. The first step (a) in forming fence conductors is shown in FIG. 2 wherein a first dielectric 212 may be deposited on a surface of a semiconductor substrate 210 for each of the plurality of semiconductor dice 104. In the next step (b) the first dielectric 212 may have at least one trench 214 etched therein to a depth that may help determine a dimension, e.g., depth or height, of the desired fence conductors. The at least one trench 214 has walls 216. In step (c) a conductive film 218 may be deposited over exposed surfaces of the first dielectric 212 and the at least one trench 214. The conductive film(s) 218 may be selected from many different types of conductive films comprising metals, metal alloys, and non-metallic but conductive compounds that would be suitable for the conductive fences disclosed herein, as would be readily apparent to one having ordinary skill in the art of semiconductor integrated circuit fabrication and also having the benefit of this disclosure.

Referring now to FIG. 3, in step (d) the conductive film 218 may be removed, e.g., etched, from the top surface of the first dielectric 212 and the bottom of the at least one trench 214, leaving only conductive film 218 "vertical fences" on the vertical walls of the at least one trench 214. Rounding at the top portion of the conductive film 218 may occur (not shown). In step (e) a second dielectric 212a may be deposited over the exposed surfaces of the first dielectric 212 and the conductive films 218 on the vertical walls of the at least one trench 214 sufficiently thick enough to fill in the gap comprising the at least one trench 214 and the remaining conductive films 218. In step (f) the second dielectric 212a may be removed, e.g., polished, sufficiently deep enough to expose the tops of the fence conductor conductive films 218, thereby allowing further electrical connections thereto.

The first dielectric layer 212 may be, for example but is not limited to, SiN, $SiO_2$, $SiO_xN_y$, etc. The second dielectric layer 212a may be, for example but is not limited to, SiN, $SiO_2$, $SiO_xN_y$, etc. The conductive film 218 may be, for example but is not limited to, Al, Ta, TaN, Ti, TiN, Si, WSi, CoSi, etc.

The thickness of the first dielectric layer 212 may be from about 100 to about 2000 nanometers. The thickness of the second dielectric layer 212a may be from about 100 to about 2000 nanometers. The thickness of the conductive film 218 may be from about 10 to about 1000 nanometers. The depth of the at least one trench 214 may be from about 100 to about 2000 nanometers. The width of the at least one trench 214 may be from about 100 to about 2000 nanometers.

Figure 4:
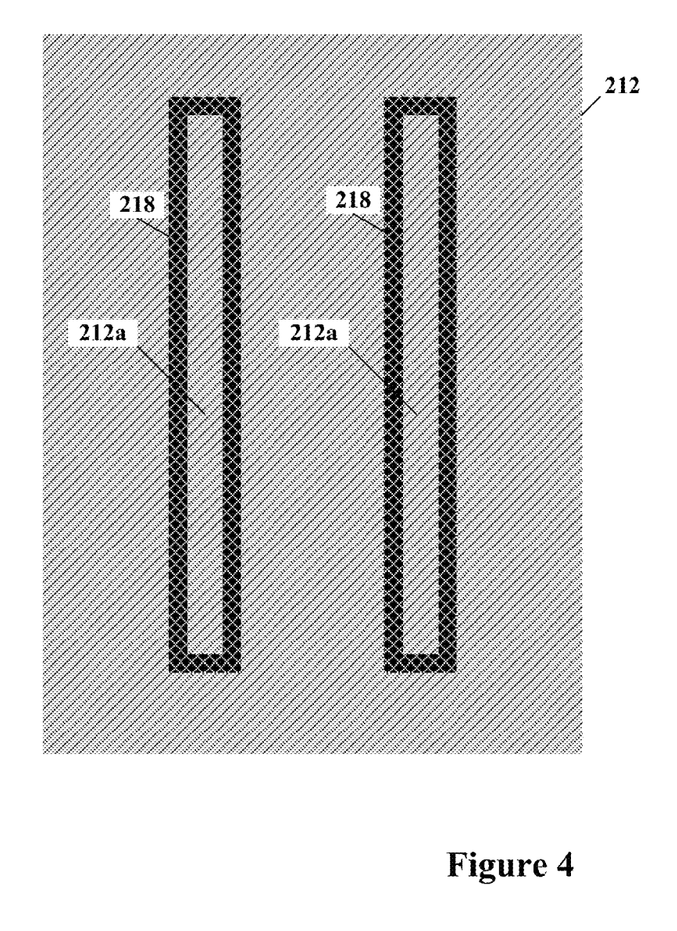
FIG. 4 illustrates a schematic plan view diagram of a plurality of sub-lithographic patterns of conductive lines formed in a semiconductor die, according to a specific example embodiment of this disclosure.
Figure 5:
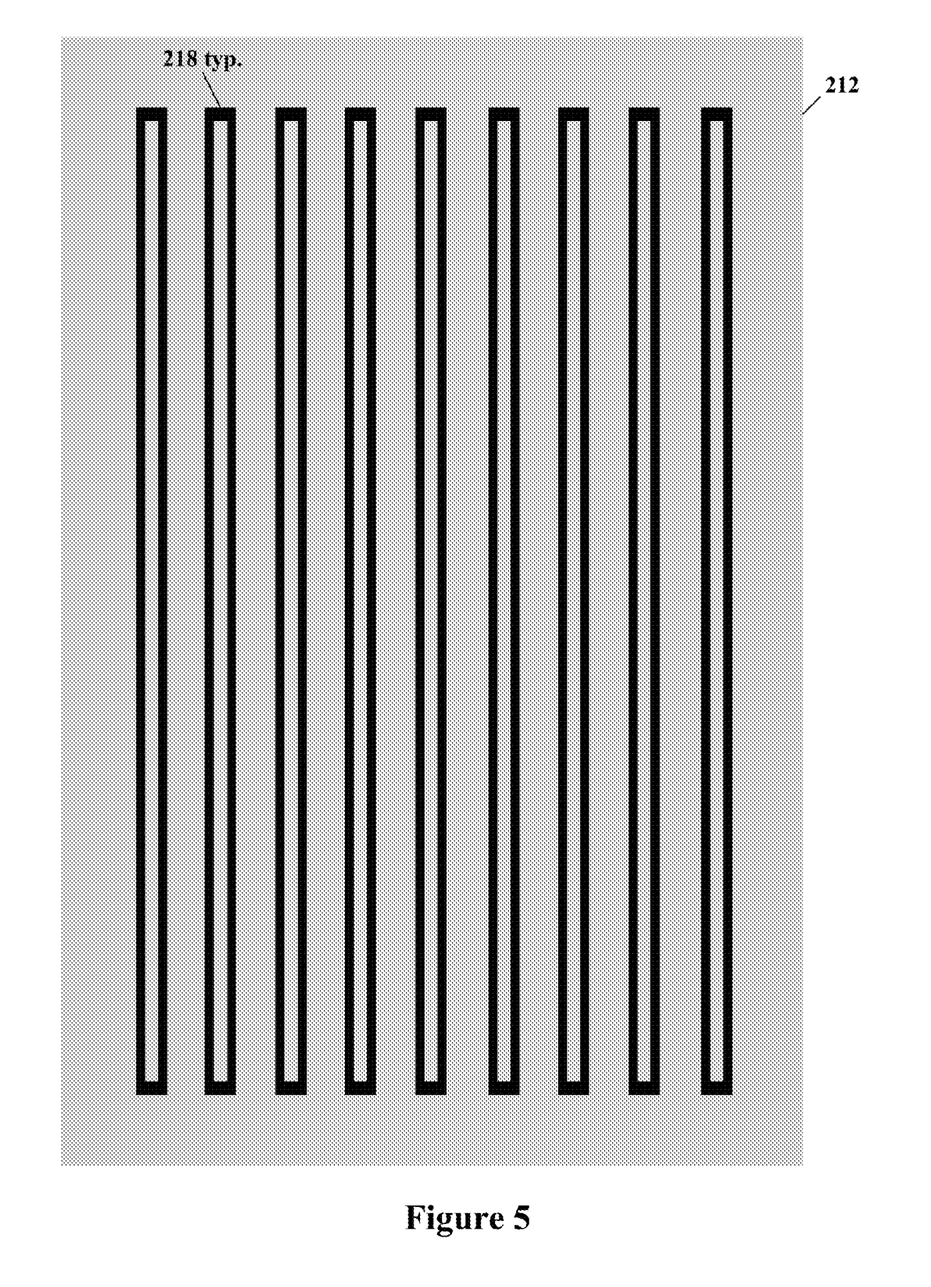
FIG. 5 illustrates a schematic plan view diagram of a plurality of sub-lithographic patterns of conductive lines formed in a semiconductor die, according to a specific example embodiment of this disclosure.

Referring to FIGS. 4 and 5, depicted are schematic plan view diagrams of a plurality of sub-lithographic patterns of conductive lines formed in a semiconductor die, according to specific example embodiments of this disclosure. After removal of the second dielectric 212a down to where the tops of the fence conductor conductive films 218 are exposed as shown in FIG. 3 step (f), the continuous conductive films 218 are ready for further processing. The continuous conductive films 218, hereinafter referred to as "fence conductors" 218 or "conductive films" 218, must be separated in order to form useful independent circuit conductors. The plurality of fence conductors 218 shown in FIGS. 4 and 5 may represent conductors used for a semiconductor transistor array.

Figure 6:
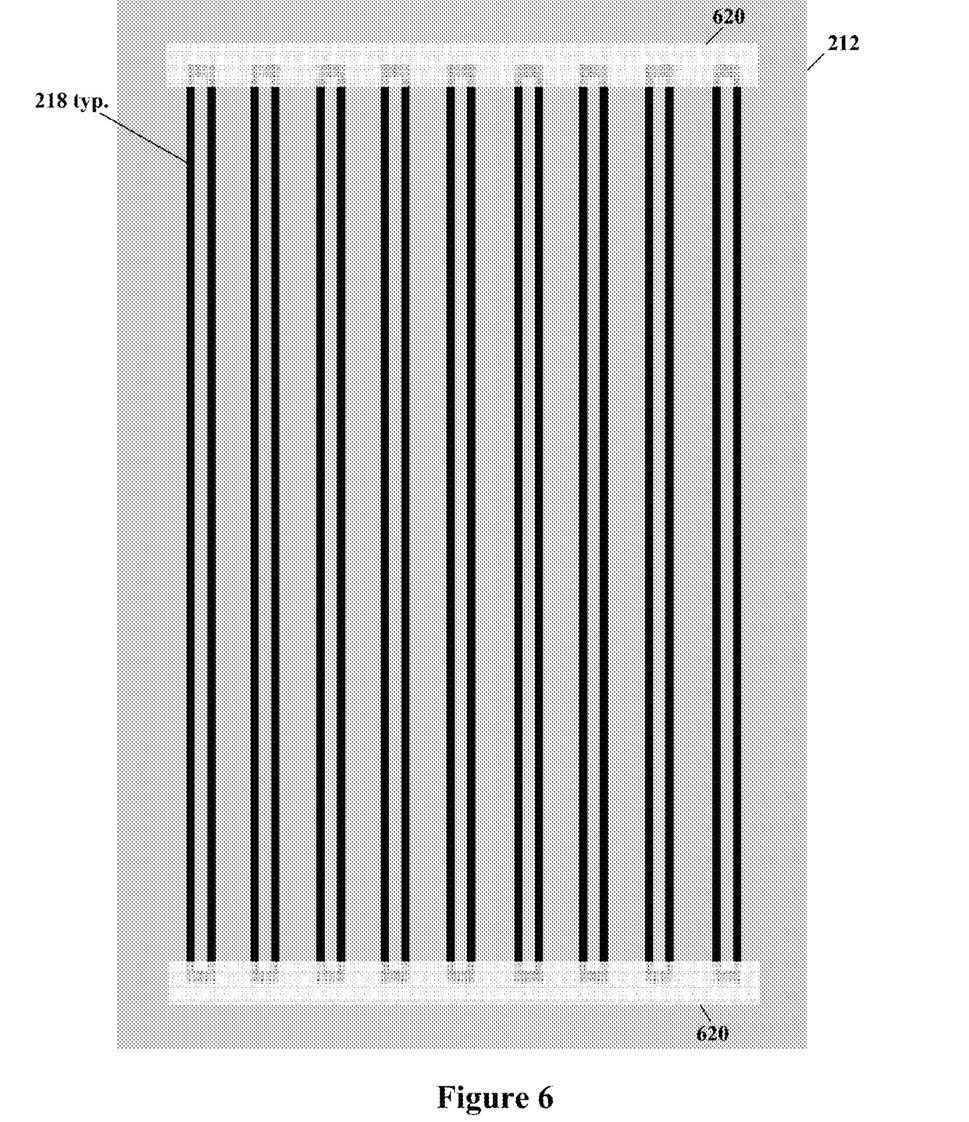
FIG. 6 illustrates a schematic plan view diagram of the plurality of sub-lithographic patterns of conductive lines shown in FIG. 5 being prepared for separating the conductive lines from each other, according to a specific example embodiment of this disclosure.

Referring to FIG. 6, depicted is a schematic plan view diagram of the plurality of sub-lithographic patterns of conductive lines shown in FIG. 5 being prepared for separating the conductive lines from each other, according to a specific example embodiment of this disclosure. The ends of the of fence conductors 218, represented by the numeral 620, are to be broken, e.g., separated apart, disconnections made therebetween, etc. The ends 620 may be routed to a "safe" area on the die 104 and may be "severed" (cut) with a removal process such as, for example but not limited to, aggressive reactive-ion etching (RIE), where the ends 620 are exposed and the remainder of the plurality of fence conductors 218 are protected from the RIE, e.g., masked.

Figure 7:
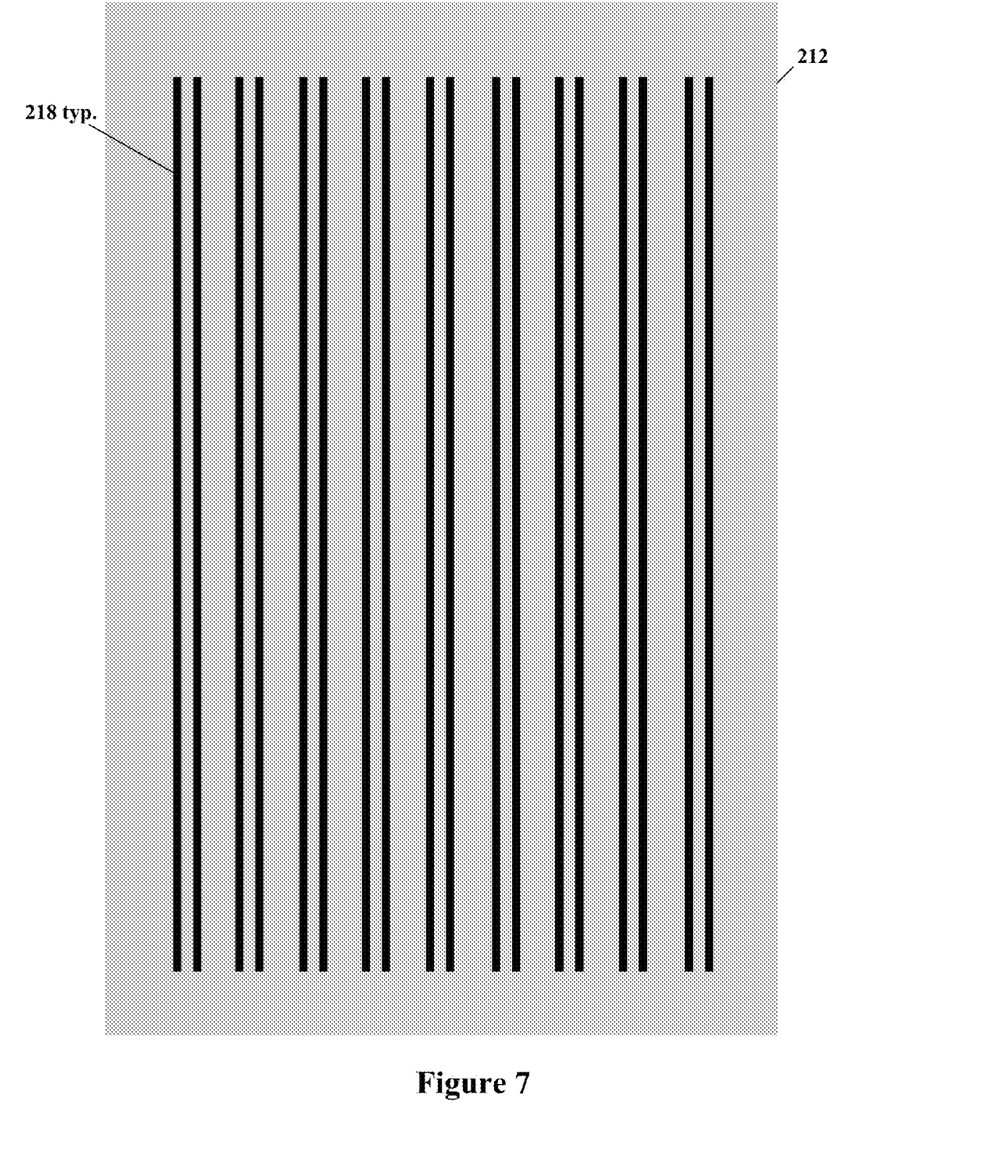
FIG. 7 illustrates a schematic plan view diagram of the plurality of sub-lithographic patterns of conductive lines shown in FIGS. 5 and 6 with portions of the conductive lines removed to separate the conductive lines from each other, according to a specific example embodiment of this disclosure.

Referring to FIG. 7, depicted is a schematic plan view diagram of the plurality of sub-lithographic patterns with portions of the conductive lines removed to separate the conductive lines from each other, according to a specific example embodiment of this disclosure. After the ends 620 have been removed, a third dielectric fill (not shown) may be required to fill the gaps created by the RIE process. Once this third dielectric fill has been completed, a chemical mechanical planarization (CMP) process may be performed on the face of the die 104. The RIE mask may also be performed Via like to selectively break the fence conductors 218 at any place on the die 104.

Figure 8:
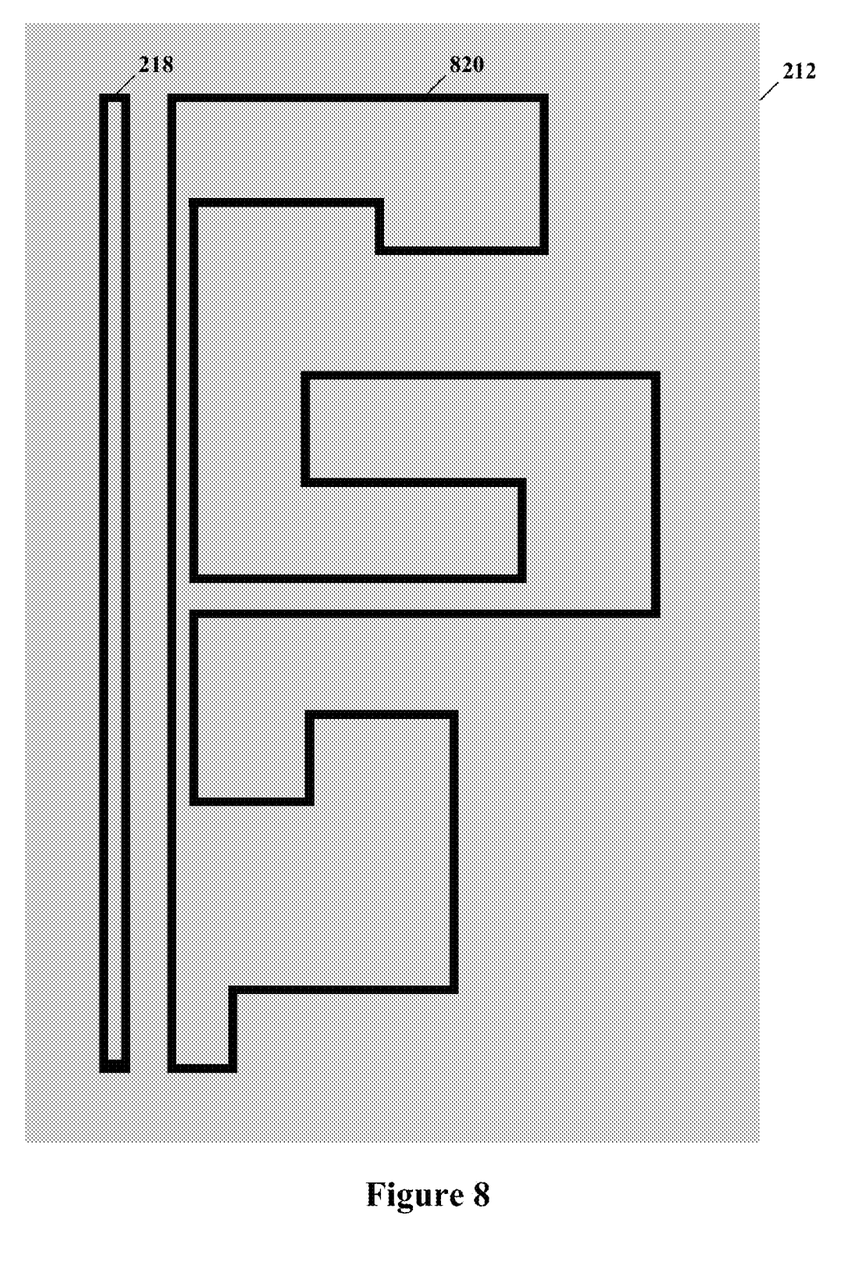
FIG. 8 illustrates a schematic plan view diagram of a plurality of sub-lithographic patterns of conductive lines having various routing paths that are formed in a semiconductor die, according to another specific example embodiment of this disclosure.

Referring to FIG. 8, depicted is a schematic plan view diagram of a plurality of sub-lithographic patterns of conductive lines having various routing paths that are formed in a semiconductor die, according to another specific example embodiment of this disclosure. Fence conductors 218 as shown have been described more fully hereinabove. In is contemplated and with the scope of this disclosure that fence conductors 820 may be routed in as many different paths as desired and configured as conductors between active elements, e.g., transistors, on the semiconductor die 104. The steps for creating a trench of this pattern and creating the fence conductors 820 may be formed through appropriate masks (not shown) and the same or similar processes as the process steps shown in FIGS. 2, 2A and 3, and the accompanying descriptions thereof as more fully described hereinabove.

Figure 9:
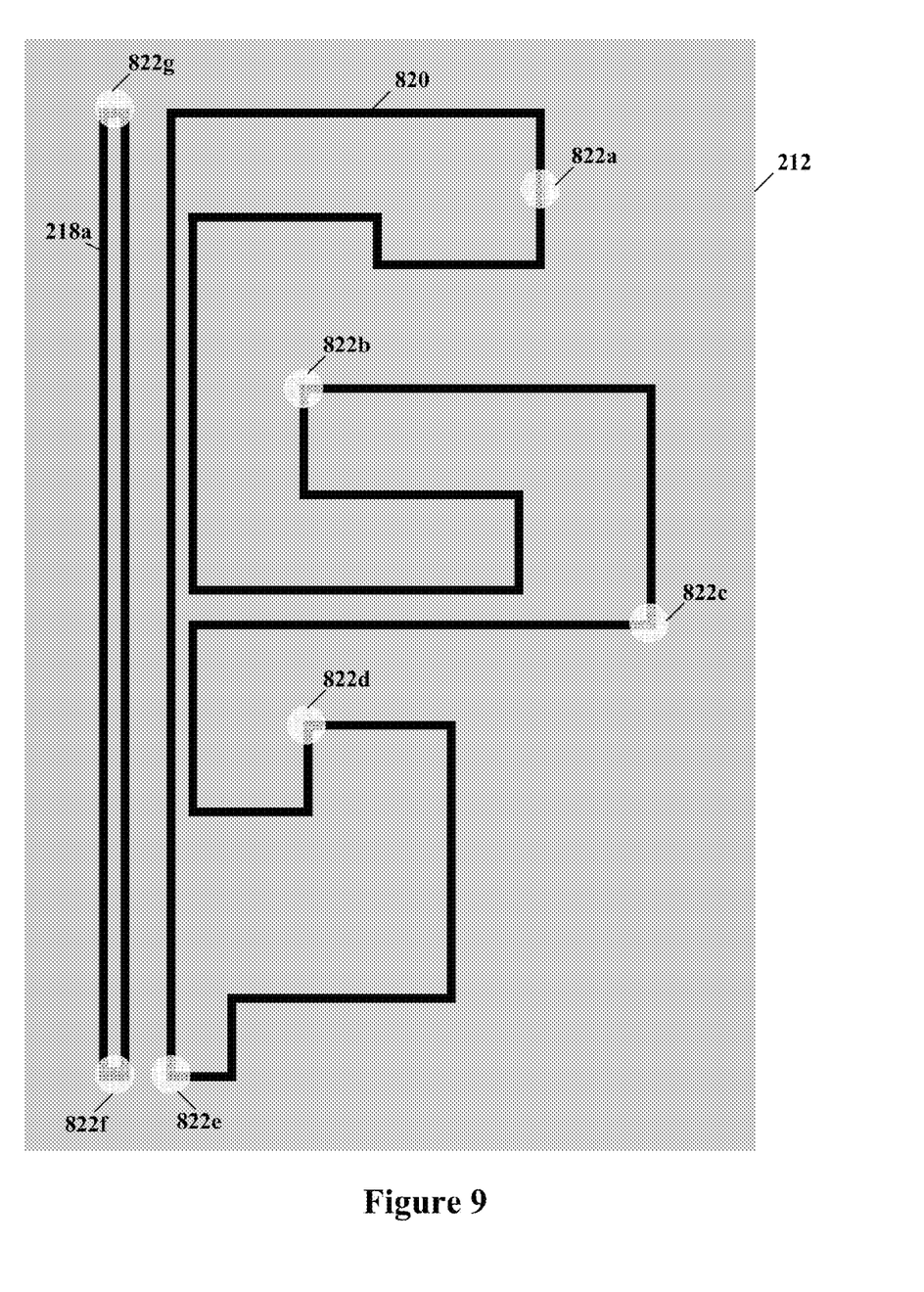
FIG. 9 illustrates a schematic plan view diagram of a plurality of sub-lithographic patterns of conductive lines having various routing paths as shown in FIG. 8 being prepared for separation into independent conductors in a semiconductor die, according to another specific example embodiment of this disclosure.

Referring to FIG. 9, depicted is a schematic plan view diagram of a plurality of sub-lithographic patterns of conductive lines having various routing paths as shown in FIG. 8 being prepared for separation into independent conductors in a semiconductor die, according to another specific example embodiment of this disclosure. The fence conductors 820 may be separated, e.g., disconnections made therebetween, at various locations, generally represented by the numeral 822, on the semiconductor die 104. These separation locations 822 may be accomplished using Via style processes as is well known to those having ordinary skill in the art of semiconductor manufacturing and having the benefit of this disclosure.

Figure 10:
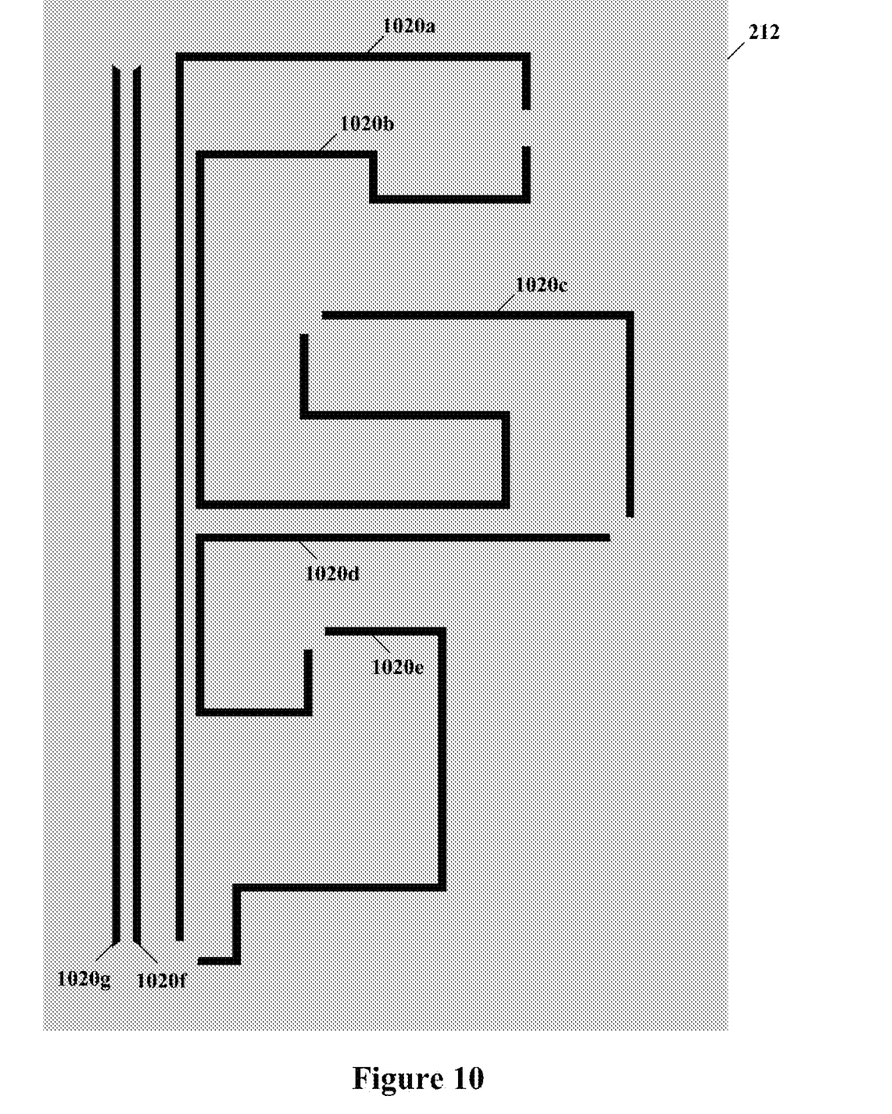
FIG. 10 illustrates a schematic plan view diagram of a plurality of sub-lithographic patterns of conductive lines having various routing paths as shown in FIGS. 8 and 9 after being separated into independent conductors in a semiconductor die, according to another specific example embodiment of this disclosure.

Referring to FIG. 10, depicted is a schematic plan view diagram of a plurality of sub-lithographic patterns of conductive lines having various routing paths as shown in FIGS. 8 and 9 after being separated into independent conductors in a semiconductor die, according to another specific example embodiment of this disclosure. The via style fence separations may be filled in with another dielectric process deposition, then the fully separated fence conductors 1020 may be further connected to the active elements, e.g., transistors, and other connection nodes (not shown) in the semiconductor die 104.

Figure 11:
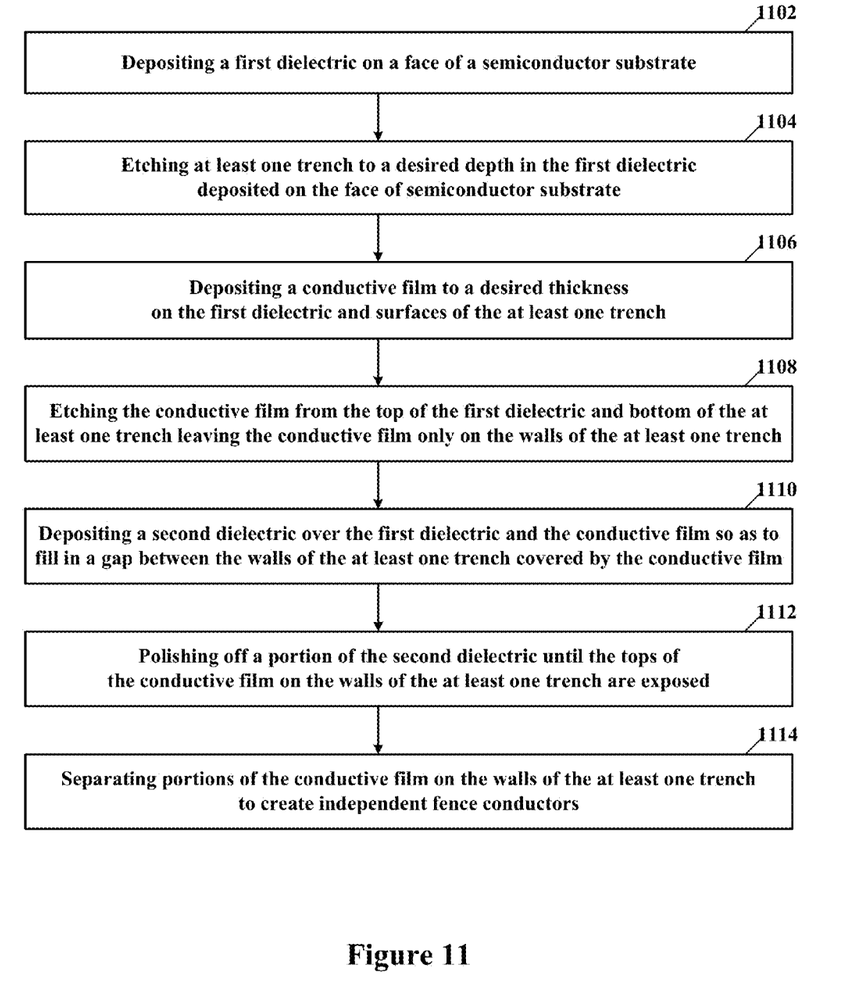
FIG. 11 illustrates a schematic process flow diagram for forming a plurality of sub-lithographic patterns of conductive lines in a semiconductor die, according to specific example embodiments of this disclosure.

Referring to FIG. 11, depicted is a schematic process flow diagram for forming a plurality of sub-lithographic patterns of conductive lines in a semiconductor die, according to specific example embodiments of this disclosure. In step 1102 a first dielectric 212 may be deposited on a face of a semiconductor substrate (die) 210. In step 1104 at least one trench 214 may be etched into the dielectric 212. In step 1106 a conductive film 218 may be deposited to a desired thickness on the first dielectric 212 and the at least one trench 214. In step 1108 the conductive film 218 may be etched from the top of the first dielectric 212 and the bottom of the at least one trench 214. In step 1110 second dielectric 212a may be deposited over the first dielectric 212 and the remaining conductive films 218 on the walls of the at least one trench 214 so as to fill in the gap therebetween. In step 1112 a portion of the second dielectric 212a may be removed, e.g., polished off, until the tops of the conductive films 218 may be exposed for further processing thereto. In step 1114 portions of the conductive films 218 may be separated, e.g., disconnections made therebetween, so as to create independent fence conductors 1020 that may be used to interconnect active devices (not shown) in the semiconductor die 104.

Figure 12:
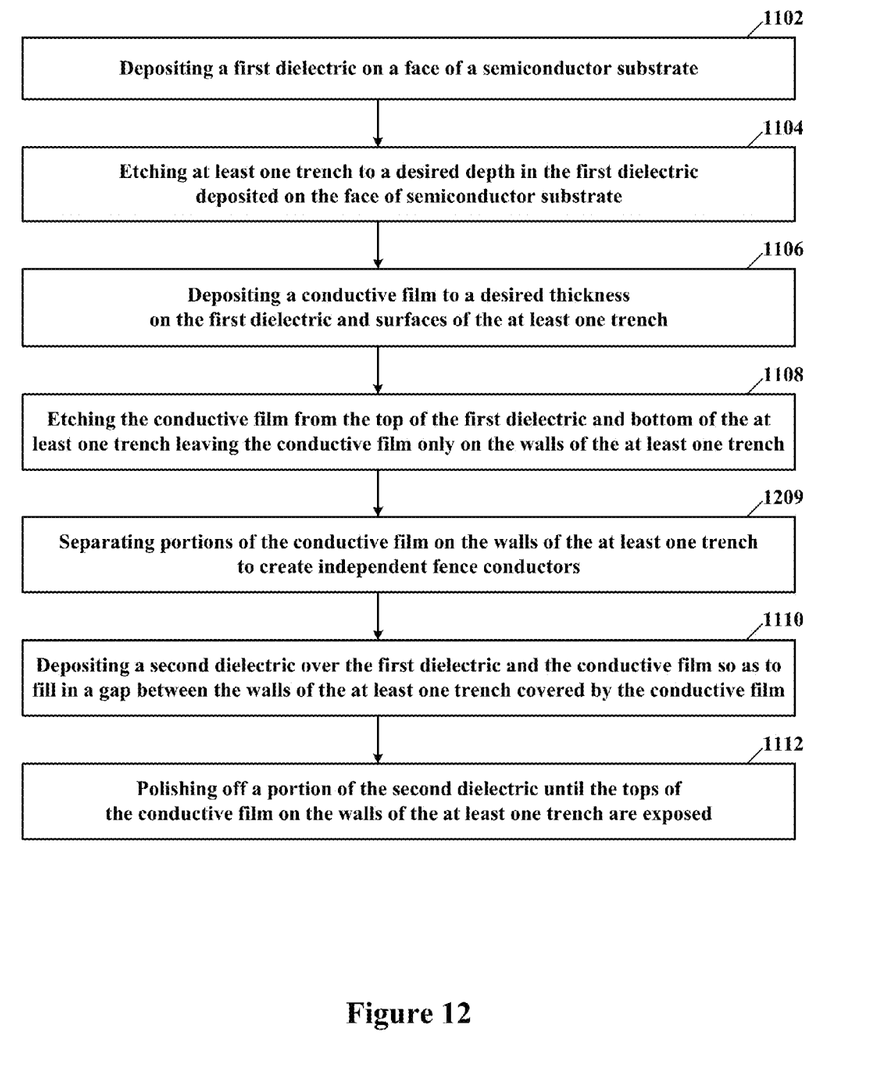
FIG. 12 illustrates a schematic process flow diagram for forming a plurality of sub-lithographic patterns of conductive lines in a semiconductor die, according to other specific example embodiments of this disclosure.

Referring to FIG. 12, depicted is a schematic process flow diagram for forming a plurality of sub-lithographic patterns of conductive lines in a semiconductor die, according to other specific example embodiments of this disclosure. In step 1102 a first dielectric 212 may be deposited on a face of a semiconductor substrate (die) 210. In step 1104 at least one trench 214 may be etched into the dielectric 212. In step 1106 a conductive film 218 may be deposited to a desired thickness on the first dielectric 212 and the at least one trench 214. In step 1108 the conductive film 218 may be etched from the top of the first dielectric 212 and the bottom of the at least one trench 214. In step 1209 portions of the conductive films 218 may be separated, e.g., disconnections made therebetween, so as to create independent fence conductors 1020 that may be used to interconnect active devices (not shown) in the semiconductor die 104. In step 1110 second dielectric 212a may be deposited over the first dielectric 212 and the remaining conductive films 218 on the walls of the at least one trench 214 so as to fill in the gap therebetween. In step 1112 a portion of the second dielectric 212a may be removed, e.g., polished off, until the tops of the conductive films 218 may be exposed for further processing thereto.

While embodiments of this disclosure have been depicted, described, and are defined by reference to example embodiments of the disclosure, such references do not imply a limitation on the disclosure, and no such limitation is to be inferred. The subject matter disclosed is capable of considerable modification, alteration, and equivalents in form and function, as will occur to those ordinarily skilled in the pertinent art and having the benefit of this disclosure. The depicted and described embodiments of this disclosure are examples only, and are not exhaustive of the scope of the disclosure.

What is claimed is:

1. A method for forming fence conductors in a semiconductor integrated circuit die, said method comprising the steps of:
    depositing a first dielectric on a face of a semiconductor substrate;
    creating at least one trench in the first dielectric wherein the step of creating the at least one trench comprises the step of creating the at the least one trench to a depth of from about 100 to about 2000 nanometers in the first dielectric;
    depositing a conductive film on the first dielectric including walls and a bottom of the at least one trench;
    removing portions of the conductive film from a face of the first dielectric and the bottom of the at least one trench, wherein only the conductive film remains on the walls of the at least one trench;
    depositing a second dielectric between the conductive film on the walls of the at least one trench; and
    removing a portion of the second dielectric to expose top portions of the conductive film on the walls of the at least one trench.

2. The method according to claim 1, wherein after the step of removing a portion of the second dielectric to expose top portions of the conductive film on the walls of the at least one trench, further comprises the step of separating portions of the conductive film on the walls of the at least one trench into independent fence conductors.

3. The method according to claim 1, wherein after the step of removing portions of the conductive film from a face of the first dielectric and the bottom of the at least one trench, further comprises the step of separating portions of the conductive film on the walls of the at least one trench into independent fence conductors.

4. The method according to claim 1, wherein the step of depositing the first dielectric comprises the step of depositing the first dielectric to a thickness of from about 100 to about 2000 nanometers on the face of the semiconductor substrate.

5. The method according to claim 1, wherein the step of creating the at least one trench comprises the step of creating the at the least one trench having a width of from about 100 to about 2000 nanometers in the first dielectric.

6. The method according to claim 1, wherein the step of depositing the conductive film comprises the step of depositing the conductive film to a thickness of from about 10 to about 1000 nanometers.

7. The method according to claim 1, wherein the step of depositing the second dielectric comprises the step of depositing the second dielectric to a thickness of from about 100 to about 2000 nanometers.

8. The method according to claim 1, wherein the conductive film comprises an aluminum film.

9. The method according to claim 1, wherein the conductive film is selected from the group consisting of Ta, TaN, Ti, TiN, Si, WSi and CoSi.

10. The method according to claim 1, wherein the step of separating portions of the conductive film comprises the step of separating portions of the conductive film with reactive-ion etching (RIE).

11. The method according to claim 10, wherein the RIE is aggressive.

12. The method according to claim 10, further comprising the steps of filling gaps created by the RIE with dielectric and chemical mechanical planarization (CMP) polishing thereof.

13. A semiconductor die, comprising:
    a semiconductor substrate;
    a first dielectric on a face of the semiconductor substrate;
    at least one trench in the first dielectric wherein the at least one trench has a depth from about 100 to 2000 nanometers;
    conductive films on walls of the at least one trench; and
    a second dielectric filling a space between the conductive films on the walls of the at least one trench, wherein the conductive films are separated and used as fence conductors to connect active elements of said semiconductor die.

14. The semiconductor die according to claim 13, further comprising a semiconductor wafer comprising a plurality of semiconductor dice.

15. The semiconductor die according to claim 13, wherein the first dielectric has a thickness from about 100 to about 2000 nanometers.

16. The semiconductor die according to claim 13, wherein the at the least one trench has a width from about 100 to about 2000 nanometers.

17. The semiconductor die according to claim 13, wherein the conductive films have a thickness of from about 10 to about 1000 nanometers.

18. The semiconductor die according to claim 13, wherein the second dielectric has a thickness from about 100 to about 2000 nanometers.

19. The semiconductor die according to claim 13, wherein the conductive film is selected from the group consisting of Al, Ta, TaN, Ti, TiN, Si, WSi and CoSi.

* * * * *